United States Patent [19]

Forouhar et al.

[11] Patent Number: 5,257,276

[45] Date of Patent: Oct. 26, 1993

[54] STRAINED LAYER INP/INGAAS QUANTUM WELL LASER

[75] Inventors: Siamak Forouhar, Pasadena, Calif.; Anders G. Larsson, Billdal, Sweden; Alexander Ksendzov, Burbank; Robert J. Lang, Altadena, both of Calif.

[73] Assignee: California Institute of Technology, Pasadena, Calif.

[21] Appl. No.: 862,722

[22] Filed: Apr. 3, 1992

[51] Int. Cl.$^5$ .............................................. H01S 3/19
[52] U.S. Cl. ...................................... 372/45; 372/46; 257/18
[58] Field of Search ................ 372/45, 46; 257/14, 257/18, 15

[56] References Cited

U.S. PATENT DOCUMENTS

| | | | |
|---|---|---|---|
| 5,042,049 | 8/1991 | Ohtoshi et al. | 372/45 |
| 5,136,602 | 8/1992 | Sugawara | 372/45 |
| 5,155,738 | 10/1992 | Ijichi et al. | 372/45 |

OTHER PUBLICATIONS

"CW Lasing in GaInAsSb/GaSb Buried Channel Laser (T=20° C., λ=2.0 μm)", A. N. Baranov, T. N. Danilova, B. E. Dzhurtanov, A. N. Imenkov, S. G. Konnikov, A. M. Litvak, V. E. Usmanskii, and Yu. P. Yakovlev, *Sov. Tech. Phys. Lett.* 14(9), Sep. 1988, pp. 727-729.

"Efficient GaInAsSb/AlGaAsSb Diode Lasers Emitting at 2.29 μm", S. J. Eglash and H. K. Choi, *Appl. Phys. Lett.* 57(13), Sep. 24, 1990, pp. 1292-1293.

"High-Efficiency High-Power GaInAsSb-AlGaAsSb Double-Heterostructure Lasers Emitting at 2.3 μm", Hong K. Choi and Stephen J. Eglash, *IEEE Journal of Quantum Electronics*, vol. 27, No. 6, Jun. 1991, pp. 1555-1559.

"MBE-Grown InAs/GaInAs Strained-Layer MQW Lasers with GaInAs/AlInAs Modified SCH Structure", Y. Matsushima, H. Kato, and K. Utaka, Proc. GaAs Symp. Karuizawa 1989.

"1.5=λ=1.7 μm Strained Multiquantum Well InGaAs-/InGaAsP Diode Lasers", D. P. Bour, R. U. Martinelli, R. E. Enstrom, T. R. Stewart, N. G. DiGiuseppe, F. Z. Hawrylo and D. B. Cooper, *Electron. Lett.*, Jan. 2, 1992, vol. 28, pp. 37-39.

"Critical layer thickness in strained $Ga_{1-x}In_xAs/InP$ Quantum Wells", H. Temkin, D. G. Gershoni, S. N. G. Chu, J. M. Vandenberg, R. A. Hamm, and M. B. Panish, *Appl. Phys. Lett.* 55(16), Oct. 16, 1989, pp. 1668-1670.

"Strained Multiple Quantum Well Lasers Emitting at 1.3 μm Grown by Low-Pressure Metalorganic Vapor Phase Epitaxy", D. Coblentz, T. Tanbun-Ek, R. A. Logan, A. M. Sergent, S. N. G. Chu, and P. S. Davisson, *Appl. Phys. Lett.* 59 (4), Jul. 22, 1991, pp. 405-407.

(List continued on next page.)

*Primary Examiner*—Georgia Y. Epps
*Attorney, Agent, or Firm*—Norman E. Brunell

[57] ABSTRACT

Strained layer single or multiple quantum well lasers include an InP substrate, a pair of lattice-matched InGaAsP quarternary layers epitaxially grown on the substrate surrounding a pair of lattice matched $In_{0.53}Ga_{0.47}As$ ternary layers surrounding one or more strained active layers of epitaxially grown, lattice-mismatched $In_{0.75}Ga_{0.25}As$. The level of strain is selected to control the bandgap energy to produce laser output having a wavelength in the range of 1.6 to 2.5 μm. The multiple quantum well structure uses between each active layer. Diethyl zinc is used for p-type dopant in an InP cladding layer at a concentration level in the range of about $5 \times 10^{17}/cm^3$ to about $2 \times 10^{18}/cm^3$. Hydrogen sulfide is used for n-type dopant in the substrate at a concentration level in the range of about $1 \times 10^{18}/cm^3$.

24 Claims, 2 Drawing Sheets

OTHER PUBLICATIONS

"Properties of AlGaAsSb-GaSb Heterojunction Injection Lasers in the 1.4–1.8 µWavelength Range", Ya A. Aarik, L. M. Dolginov, A. E. Drakin, L. V. Druzhinina, P. G. Eliseev, P. A. Lyuk, B. N. Sverdlov, V. A. Skripkin, and Ya. F. Friedentkhal, *Sov. J. Quantum Electron.* 10(1), Jan. 1980, pp. 50–53.

"InAsPSb/InAs Diode Laser Emitting in the 2–5 µm Range", S. Akiba, Y. Matsushima, T. Iketani, and M. Usami, *Electronics Letters*, Aug. 18, 1988, vol. 24, No. 17, pp. 1069–1071.

"Growth of Strained InAs/InP Quantum Wells by Molecular Beam Epitaxy", M. Hopkinson, J. P. R. David, P. A. Claxton, and P. Kightley, *Appl. Phys. Lett.* 60 (7), Feb. 17, 1992, pp. 841–843.

"Low Threshold Highly Efficient Strained Quantum Well Lasers at 1–5 Micrometer Wavelength", U. Koren, M. Oron, M. G. Young, B. I. Miller, J. L. De Miguel, G. Raybon, and M. Chien, *Electronics Letters*, Mar. 29, 1990, vol. 26, No. 7, pp. 465–467.

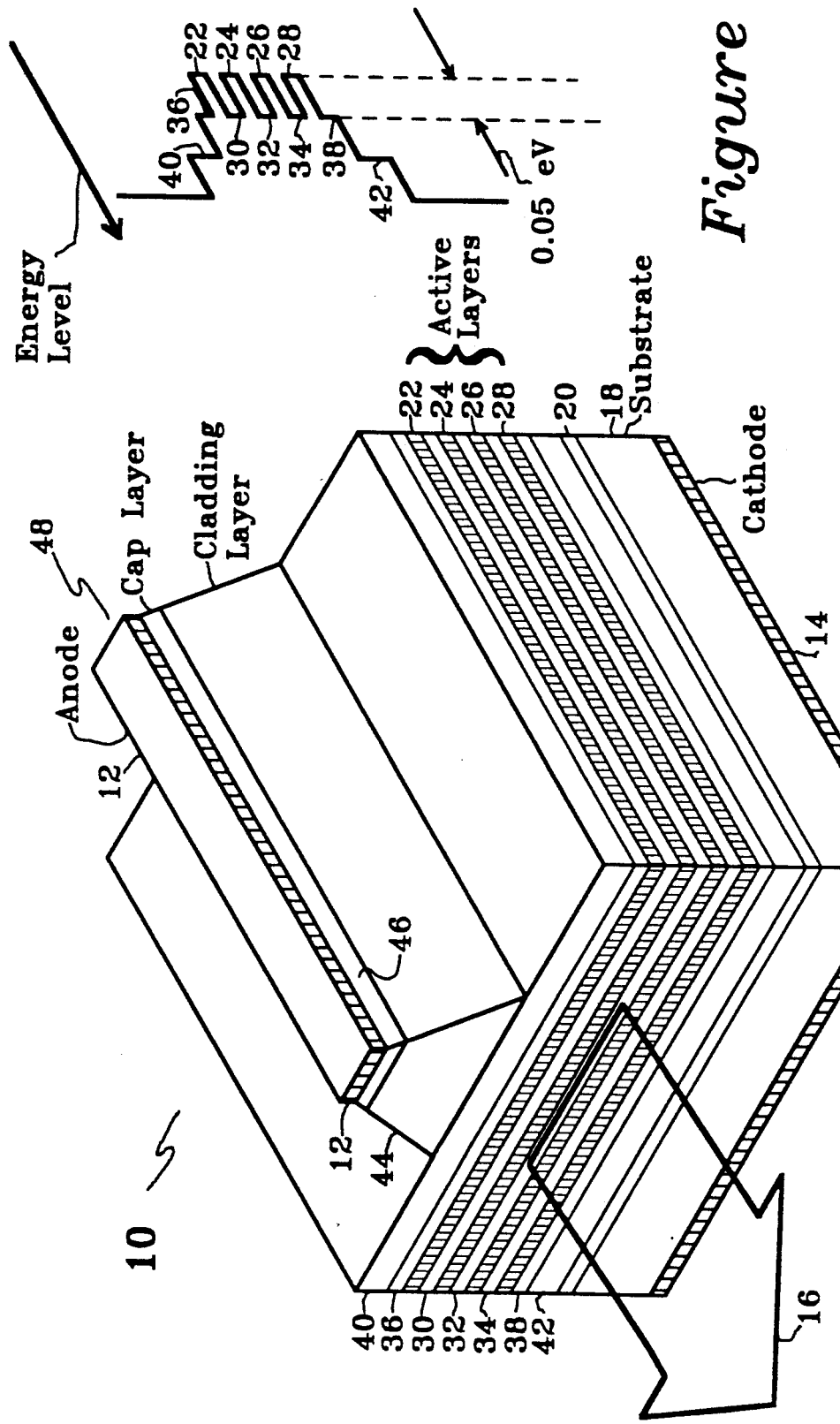

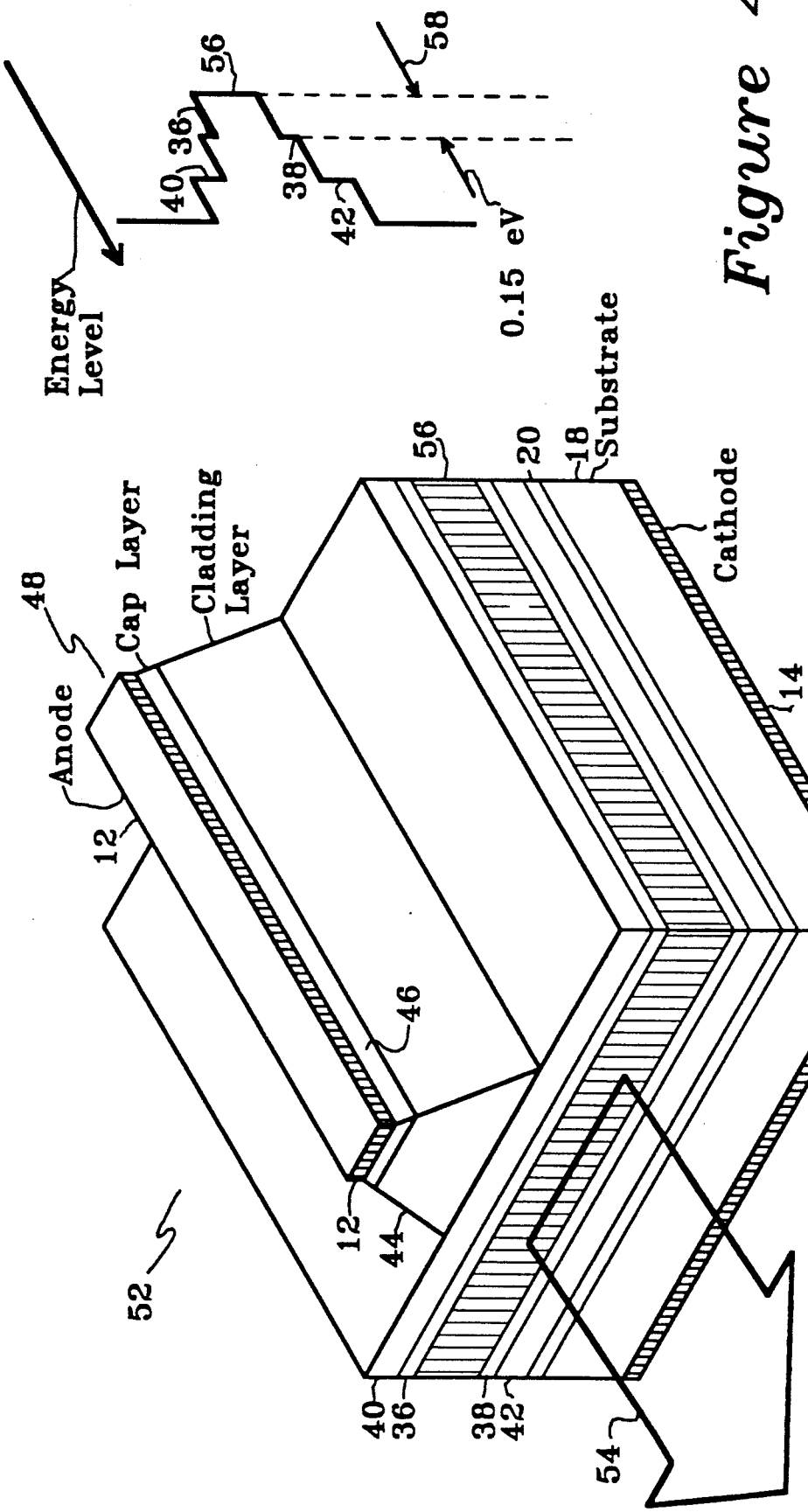

5,257,276

STRAINED LAYER INP/INGAAS QUANTUM WELL LASER

ORIGIN OF THE INVENTION

The invention described herein was made in the performance of work under a NASA contract, and is subject to the provisions of Public Law 96-517 (35 USC 202) in which the Contractor has elected to retain title

BACKGROUND OF THE INVENTION

1. Field of the Invention

The present invention relates to infrared semiconductor lasers and in particular to such lasers for use in the range of about 1.6 to about 2.5 μm.

2. Description of the Prior Art

Single-mode semiconductor lasers, with radiation in the mid-infrared region in the range of about 1.6 to about 2.5 μm, are required for light detection and ranging (LIDAR) applications employing atmospheric transmission windows for remote sensing of atmospheric gasses which absorb radiation strongly in this range.

Lasers in the mid-infrared range using gallium antimonide (GaSb) alloy systems, have been demonstrated at discrete wavelengths within a spectral region from about 1.8 to about 4 μm. Structures using the GaSb alloy system are, however, difficult to work with, have low thermal conductivities and dissociate in the temperature ranges used for conventional semiconductor laser fabrication techniques such as regrowth GaSb structures cannot therefore easily be manufactured in complex configurations such as distributed feedback (DFB) lasers or buried mesa configurations.

Semiconductor lasers using the indium phosphide (InP) systems are well known and easily worked, but conventional designs for such lasers using such are limited to a maximum wavelength of about 1.6 μm for lattice matched systems InP alloy systems are usually used at wavelengths of 1.3 and 1.55 μm, in lattice matched and lattice mismatched configurations, to match the characteristics of glass fibers used in fiber optic transmission systems.

The operating wavelength of semiconductor lasers using the InP alloy system may be lengthened by the use of strained active layers in which the active layers are not lattice matched, that is, are lattice mismatched, to the substrate and other epitaxial layers. The lattice mismatch may be controlled by the relative percentage composition of the indium and gallium. For example, $In_{0.53}Ga_{0.47}As$ layers have a sufficiently similar crystal structure to the InP substrate to be lattice matched thereto, while $In_{0.75}Ga_{0.25}As$ layers have sufficiently different crystal structures to be mismatched with an InP substrate and form strained layers.

As a strained active layer is made thicker, the bandgap energy decreases, increasing the resonant wavelength. Multiple quantum well structures may then be used to increase the gain or efficiency of such chip lasers. In particular, strained layer, multiple quantum well (SL-MQW) configurations are known for use at 1.55 μm to efficient produce laser light sources for fiber optic cables used in telecommunications applications.

There is a limit, however, known as the critical limit, beyond which the thickness of the strained active layer or layers may not be further increased to increase the operating wavelength of semiconductor lasers. The lasers will not operate for very long, if at all, beyond the critical limit.

What is needed are techniques for conveniently building semiconductor lasers with known fabrication techniques that will reliably produce laser output in the range of about 1.6 to about 2.5 μm.

SUMMARY OF THE INVENTION

The preceding and other shortcomings of the prior art are addressed and overcome by the present invention that provides, in a first aspect, a semiconductor laser suitable for use in the region of about 1.6 to about 2.5 μm fabricated using InGaAs strained quantum well active layers on an InP substrate in which the strain in the active layer is used to control the effective band gap energy over a wide range.

In another aspect, the present invention provides a strained layer quantum well laser including an InP substrate, a pair of lattice-matched InGaAsP quarternary layers epitaxially grown on the substrate, one or more strained active layers of epitaxially grown, lattice-mismatched InGaAs within the quarternary layers, and means for injecting current into the one or more active layers to produce laser output, the level of strain in the one or more active layers being selected to control the bandgap energy so that said laser output is light having a wavelength in the range of 1.6 to 2.5 μm.

The foregoing and additional features and advantages of this invention will become further apparent from the detailed description and accompanying drawing figures that follow. In the figures and written description, numerals indicate the various features of the invention, like numerals referring to like features throughout both the drawing figures and the written description.

BRIEF DESCRIPTION OF THE DRAWING

FIG. 1 is an isometric view of a strained layer multiple quantum well (SL-MQW) ridge waveguide semiconductor laser in accordance with the present invention.

FIG. 2 is a graph, matching the isometric view of the semiconductor laser shown in FIG. 1, which illustrates the relative energy levels in the various layers of the laser chip.

FIG. 3 is an isometric view of a strained layer single quantum well (SL-SQW) ridge waveguide semiconductor laser in accordance with the present invention.

FIG. 4 is a graph, matching the isometric view of the semiconductor laser shown in FIG. 3, which illustrates the relative energy levels in the various layers of the laser chip.

DETAILED DESCRIPTION OF THE PREFERRED EMBODIMENT

Referring now to FIG. 1, strained layer multi-quantum well (SL-MQW) semiconductor laser 10 according to the present invention is energized by the application of electric power between anode 12 and cathode 14 to produce laser output in the form of radiation 6 and have a wavelength in the range of about 1.6 to about 2.5 μm. In a particular embodiment described in greater detail herein, SL-MQW laser 10 produced radiation 16 at about 1.6 μm.

SL-MQW laser 10 is fabricated with the well known indium-gallium-arsenide-phosphide (InGaAsP) alloy system to include indium-gallium-arsenide (InGaAs) SL-MQW injection lasers grown by atmospheric metal-organic vapor phase epitaxy (MOVPE) to form active layers on (100) oriented n-doped indium phosphide (InP) substrate 18 using trimethyl alkyls of gallium (TMGa) and indium (TMIn), arsine (AsH$_3$) and phosphine (PH$_3$).

In particular, cathode 14 is deposited on one side of n-InP substrate 18 and thin buffer layer 20 of pure n-InP on the other. InP substrate 18 is on the order of 500 $\mu$m wide and 1 mm deep, with radiation 16 being emitted from the 500 $\mu$m side.

The SL-MQW laser structure consists of InGaAS strained quantum wells shown as active layers 22, 24, 26, and 28 separated by barrier layers of lattice matched ternary InGaAs, or quarternary InGaAsP, shown as barrier layers 30, 32, and 34. In a preferred embodiment, two to five and preferably four active layers of In$_x$Ga$_{1-x}$As are used where x is in the range of 0.7 to 1, preferably 0.73, and the thickness of each such active layer is in the range of about 1 to about 12 nm. The barrier layers may be lattice matched InGaAs, such as In$_{0.53}$Ga$_{0.47}$As, or In$_{1-x}$Ga$_x$As$_y$P$_{1-y}$ where x is in the range of about 0 to about 0.47. The thickness of the barrier layers is in the range of about 5 to about 40 nm and preferably about 6.5 nm.

The SL-MQW structure is sandwiched between 60 nm wide lattice-matched InGaAs ternary layers 36 and 38 which are embedded within 150 nm lattice matched InGaAsP quarternary layers 40 and 42 having a bandgap wavelength of about 1.3 $\mu$m.

SL-MQW laser 1 is shown in a ridge waveguide structure in which p-InP cladding layer 44 is formed on quarternary layer 4 and p-InGaAs cap layer 46 is then formed thereon. Quarternary layer 40 and cladding layer 44 are then partially removed to form ridge waveguide 48 as shown in FIG. 1. In particular, portions of InGaAs cap layer 46 are first removed by application of a etching solution of H$_2$SO$_4$:H$_2$O$_2$:H$_2$O after which InP cladding layer 44 is partially removed with a solution of HCl:H$_3$PO$_4$ using a SiO$_2$ mask. In this etching process, InGaAsP quarternary layer 40 acts as a stop etch layer so that the ridge depth of ridge waveguide 48 may be conveniently controlled. Anode 12 is then formed by metalization on top surface of ridge waveguide 48 which is on the order of about 5 $\mu$m wide.

In a preferred embodiment, hydrogen sulfide (H$_2$S) and diethyl zinc (DEZn) are used as n-type and p-type dopants, respectively. InP substrate 18 as well as InP buffer layer 20 have n-type dopant concentration levels of about $1 \times 10^{18}$/cm$^3$ while InP cladding layer 44 includes p-type dopant concentration levels in the range of about $5 \times 10^{17}$/cm$^3$ to about $1-2 \times 10^{18}$/cm$^3$ InGaAs cap layer 46 has p-type dopant concentration levels on the order of about $1 \times 10^{19}$/cm$^3$. Quarternary layers 40 and 42, ternary layers 36 and 38, barrier layers 30, 32, and 34 and active layers 22, 24, 26, and 28 are undoped.

Referring now to FIG. 2, the energy levels for SL-MQW laser 10 are schematically illustrated showing the lowest energy levels for active layers 22, 24, 26, and 28 and the next lowest energy levels for barrier layers 30, 32, and 34. The energy level difference between these layers, shown as operating energy level difference 50, for a preferred embodiment is in the range of about 0.05 to about 0.2 eV, much lower than conventional semiconductor lasers.

In operation of a preferred embodiment of SL-MQW laser in which cladding layer 44 was doped with p-type dopant at a concentration level of $1-2 \times 10^{18}$/cm$^3$, lasing operation was achieved in a pulsed mode at 20° C. using 1 $\mu$sec pulses at a 1 kHz repetition rate. The light vs. current characteristics of a 1 mm long laser with a threshold current of 280 mA range reasonably linearly from about 0.5 mW at 300 mA to about 5 mW at about 600 mA. The light output was measured directly by a calibrated InSb detector, not shown, which has a 500 $\mu$m diameter active area and a responsivity of 0.4 A/W at 1.8 $\mu$m wavelength. In this measurement, the maximum light output may have been limited by saturation of the detector, rather than by SL-MQW laser 10.

The measured differential external quantum efficiency was low, on the order of about 5% for a 400 mm long cavity. The emission spectrum of a 500 $\mu$m long cavity laser shows emissions from about 1.79 $\mu$m to about 1.81 $\mu$m with a peak at about 1.804 $\mu$m. This is believed to be the longest lasing wavelength reported for an InP alloy system device.

The current voltage characteristics of a 100 $\mu$m wide 1 mm long broad-are laser according to the present invention were observed to have a turn-on voltage of about 0.6 V and a reverse leakage current of less than about 10 $\mu$A at $-1$ V.

The relatively high threshold and low quantum efficiency may have been due, in part, to the relatively high carrier concentration of about $2 \times 10^{18}$/cm$^3$ in p-Inp cladding layer 44 and the low energy barrier of about 0.05 eV between active layers 22, 24, 26, and 28 and barrier layers 30, 32, and 34. The high carrier concentration in cladding layer 44 may increase free carrier absorption and hence the threshold current density. The low energy barrier may allow some leakage of carriers from the quantum wells.

By modifying the structure of laser chip 10 to reduce the doping concentration in cladding layer 44 to about $5 \times 10^{17}$/cm$^3$ and increase the barrier height, threshold current densities lower than 2.5 kA/cm$^2$ and external quantum efficiencies greater than 5% may be achieved.

Referring now to FIG. 3, an alternate embodiment of laser chip 10 shown in FIG. 1 is illustrated in which strained layer single quantum well (SL-SQW) semiconductor laser 52 produces radiation 54 at a wavelength of 2.1 $\mu$m. The configuration of SL-SQW laser 52 differs from that of SL-MQW laser 10 primarily in two aspects. First, only a single active InGaAs layer, preferably In$_{0.75}$Ga$_{0.25}$As in the range of about 12 nm wide, is configured as strained quantum well active layer 56 sandwiched between ternary barrier layers 36 and 38 within quarternary layers 40 and 42. Barrier layers 30, 32, and 34 shown in FIG. 1 are therefore not required. Second, the energy level difference, as shown in FIG. 4 as operating energy level difference 58, between active layer 56 and ternary barrier layers 36 and 38 is about 0.15 eV. In addition, the doping level of all layers are the same as specified for the same layers of SL-MQW laser 10, except that cladding layer 44 is doped at a concentration level of about $5 \times 10^{17}$/cm$^3$.

While this invention has been described with reference to its presently preferred embodiments, its scope is not limited thereto. Rather, such scope is only limited in so far as defined by the following set of claims and includes all equivalents thereof.

What is claimed is:

1. A strained layer quantum well laser, comprising:
    an InP substrate;
    a pair of lattice-matched InGaAsP quarternary layers epitaxially grown on the substrate;
    one or more strained active layers of epitaxially grown, lattice-mismatched InGaAs within the quarternary layers; and means for injecting current into the one or more active layers to produce laser output, the level of strain in the one or more active layers controlling the bandgap energy to produce laser output having a wavelength in the range of about 1.6 to about 2.5 μm.

2. The strained layer quantum well laser claimed in claim 1 further comprising:
a pair of lattice-matched InGaAs ternary layers epitaxially grown on the substrate between the quarternary layers and surrounding the one or more active layers.

3. The strained layer quantum well laser claimed in claim 2 wherein each of the one or more active layers comprises:
$In_xGa_{1-x}As$ wherein x is in the range of about 0.7 to 1.

4. The strained layer quantum well laser claimed in claim 3 wherein x is about 0.73.

5. The strained layer quantum well laser claimed in claim 3 further comprising:
a plurality of said active layers forming a multiple quantum well laser structure; and
a lattice-matched InGaAs barrier layer epitaxially grown between each pair of active layers.

6. The strained layer quantum well laser claimed in claim 5 wherein each barrier layer comprises:
$In_xGa_{1-x}As$ wherein x is in the range of about 0.53.

7. The strained layer quantum well laser claimed in claim 5 wherein each barrier layer comprises:
$In_{1-x}Ga_xAs_yP_{1-y}$ where x is in the range of about 0 to about 0.47.

8. The strained layer quantum well laser claimed in claim 3 further comprising:
two to five active layers each in the range of about 1 to about 12 nm thick.

9. The strained layer quantum well laser claimed in claim 8 wherein the active layers are about 3.5 nm thick.

10. The strained layer quantum well laser claimed in claim 9 wherein the barrier layers are in the range of about 5 to about 40 nm thick.

11. The strained layer quantum well laser claimed in claim 10 wherein the barrier layers are about 6.5 nm thick.

12. The strained layer quantum well laser claimed in claim 8 further comprising:
four active layers.

13. The strained layer quantum well laser claimed in claim 8 further comprising:
four of said active layers each on the order of about 3.5 nm thick; and
three of said barrier layers each on the order of about 6.5 nm thick.

14. The strained layer quantum well laser claimed in claim 8 wherein an energy level differential exists between each active and barrier layer of on the order of about 0.05 to about 0.3 eV.

15. The strained layer quantum well laser claimed in claim 8 wherein an energy level differential exists between each active and barrier layer of on the order of about 0.05.

16. The strained layer quantum well laser claimed in claim 3 further comprising:
an InP cladding layer epitaxially grown on the quarternary layer furthest from the substrate.

17. The strained layer quantum well laser claimed in claim 16 wherein said cladding layer is formed into a ridge waveguide for directing injected current into the one or more active layers.

18. The strained layer quantum well laser claimed in claim 17 further comprising:
p-type dopant in the cladding layer at a concentration level in the range of about $5 \times 10^{17}$ to about $2 \times 10^{18}$.

19. The strained layer quantum well laser claimed in claim 18 wherein said p-type dopant is diethyl zinc.

20. The strained layer quantum well laser claimed in claim 3 further comprising:
n-type dopant in the substrate at a concentration level in the range of about $1 \times 10^{18}/cm^3$.

21. The strained layer quantum well laser claimed in claim 20 wherein said n-type dopant is hydrogen sulfide.

22. The strained layer quantum well laser claimed in claim 3 wherein said active layer is a single active layer in the range of about 1 to about 12 nm thick forming a single quantum well structure.

23. The strained layer quantum well laser claimed in claim 3 wherein said active layer is a single active layer in the range of about 12 nm thick forming a single quantum well structure.

24. The strained layer quantum well laser claimed in claim 23 wherein an energy level differential exists between said active layer and said ternary layers on the order of 0.15 eV.

* * * * *